United States Patent [19]
Yoshikawa

[11] Patent Number: 5,113,142
[45] Date of Patent: May 12, 1992

[54] QAM DEMODULATOR HAVING AUTOMATIC ADAPTIVE EQUALIZER

[75] Inventor: Syuuichi Yoshikawa, Nara, Japan
[73] Assignee: Sharp Kabushiki Kaisha, Okaka, Japan
[21] Appl. No.: 630,231
[22] Filed: Dec. 19, 1990
[30] Foreign Application Priority Data
   Dec. 29, 1989 [JP] Japan .................... 1-341887
[51] Int. Cl.⁵ .......................................... H03D 3/00
[52] U.S. Cl. .................... 329/306; 329/307; 375/39; 375/80
[58] Field of Search ............ 329/304, 305, 306, 307, 329/308, 309, 310; 375/12, 13, 14, 15, 16, 39, 80, 81, 82

[56] References Cited
U.S. PATENT DOCUMENTS

| | | | |
|---|---|---|---|
| 3,723,911 | 3/1973 | Forney, Jr. | 333/18 |
| 4,004,226 | 1/1977 | Qureshi et al. | 325/42 |
| 4,771,438 | 9/1988 | Nash | 329/310 X |

Primary Examiner—David Mis

[57] ABSTRACT

A QAM demodulator having an adaptive automatic equalizer includes a transversal filter of a band-pass filter type, a reference carrier generator for generating a complex reference carrier, an error detector for obtaining complex error data, and a gain tap coefficient adjusting unit for adjusting the complex gain tap coefficients using the complex error data and the complex reference carrier data. The gain tap coefficient adjusting unit includes first complex multipliers for multiplying the complex data of the reference carrier outputted from the reference carrier generator by the input data, second complex multiplier for multiplying a predetermined coefficient by the complex error data outputted from the error detector, third complex multipliers for multiplying the output data of the first complex multipliers respectively by the output data of the second complex multiplier, thereby obtaining the complex quantity for adjusting the complex gain tap coefficients for the automatic equalizer.

9 Claims, 7 Drawing Sheets

QAM DEMODULATOR HAVING AUTOMATIC ADAPTIVE EQUALIZER

BACKGROUND OF THE INVENTION

1. Field of the Invention

The present invention relates to an automatic adaptive equalizer for use in a quadrature amplitude modulation (referred to as QAM hereinafter) signal demodulator or detection equipment. It is noted that "in quadrature" applies to two sinusoidal quantities of the same frequency having a phase difference of $\pm(\pi/2)$rad and that the term QAM is used herein broadly to include all systems in which the transmitted signal can be represented as the superposition of two modulated signals, each being obtained by pulse amplitude modulation of a signal sequence on a sinusoidal carrier, the two signal sequences being generated in synchronism at the same rate, and the two carriers being of the same frequency but 90° apart in phase. QAM thus includes a wide variety of double sideband systems, including pure phase modulation and combined amplitude and phase modulation. Phase modulated signals are considered within the scope of quadrature amplitude modulated signals. Therefore, the automatic equalizer and QAM demodulator of the present invention are also applicable for demodulation of phase modulated signals.

2. Description of the Prior Art

It is a common practice to provide a fixed or automatic equalizer with a reverse characteristic of a communication line or lines in a QAM receiver for use in a radio or wire communication line for removing distortion or non-sinusoidal signals caused due to a characteristic inherent to the communication line or lines. An automatic equalizer composed of a transversal filter with variable gain tap coefficients has a capability of following the change of the characteristics with time lapse on the communication line, and therefore the automatic equalizer has an equalizing ability superior to that of a fixed type equalizer.

FIG. 1 shows an example of a conventional QAM demodulator including an automatic equalizer, wherein the QAM demodulator utilizes digital signal processing techniques such as a digital signal processor (referred to as DSP hereinafter).

In the QAM demodulator shown in FIG. 1, a received signal which is A/D (analog-to-digital) converted through an A/D converter (not shown) is inputted to an input terminal 71 of the QAM demodulator and the input digital signal is multiplied in a complex multiplier 72 by a complex reference carrier signal generated from a reference carrier generator 74.

It is noted that the complex reference carrier referred in this specification consists of a real part and an imaginary part in which both of the parts are in quadrature to each other, in other words, the phase of the imaginary carrier is different from that of the real carrier by $\pi/2$. The complex reference carrier wave is represented as follows:

$$\exp(-j\,\omega_c\,k) = \cos\omega_c k - j\cdot\sin\omega_c k, \text{ or}$$

$$\exp(j\,\omega_c\,k) = \cos\omega_c k + j\cdot\sin\omega_c k$$

In this specification, two types of complex multipliers are utilized. In the first type of complex multiplier, a real quantity is multiplied by a complex quantity as in the complex multiplier 72 shown in FIG. 1. In the second type of the complex multiplier, a complex number is multiplied by a complex number.

The output signal of the complex multiplier 72 is entered to a low-pass filter 75 so that the components of the frequency of the entered signal which are twice the carrier are removed and wave shaping of the entered signal is performed. The output signal of the low-pass filter 75 is applied to an automatic equalizer filter 76 of a baseband type. The baseband type has a frequency response characteristic of the frequency band occupied by all the signals used to modulate a transmitted carrier. The automatic baseband equalizer filter 76 is composed of a transversal filter of a low-pass filter type. The output signal of the baseband equalizer filter 76 is applied to an error detector 77, and the output data of the error detector 77 is applied to a gain tap coefficient adjusting unit 78 which adjusts the complex gain tap coefficients for the transversal filter constructing the baseband equalizer filter 76 on the basis of the output signal of the error detector 77. Each complex number of the gain tap coefficients consists of a pair of real and imaginary parts thereof, which are stored in the equalizer and determine its characteristics.

FIG. 2 is a block diagram showing a constitution of the low-pass filter 75 and baseband equalizer filter 76. The real and imaginary parts of the complex data outputted from the complex multiplier 72 (see FIG. 1) are respectively applied to the input terminals 751 and 752 of the low-pass filter 75. The filtering operations for the real and imaginary parts of the complex data applied to the input terminals 751 and 752 are carried out through filter operating units 753 and 754 respectively. As shown in FIG. 2, the automatic baseband equalizer filter 76 includes four filter operating units 761 to 764. The real and imaginary parts of the output data of the baseband equalizer filter 76 are respectively outputted from the output terminals 765 and 766 so as to be applied to the error detector 77 (see FIG. 1).

FIG. 3 shows the automatic baseband equalizer filter 76, error detector 77 and gain tap coefficient adjusting unit 78 further in detail. In FIG. 3, all of the data transmitted between the circuit components are complex data each having a pair of real and imaginary parts.

The automatic baseband equalizer filter 76 is a transversal filter, which comprises three complex gain tap coefficient memory units 767, three multipliers 768, two complex delay registers 769 and an adder 770. In each of the multipliers 768, a multiplication represented by an expression (1) is performed as follows, provided that the input complex data applied to the input terminal 760 is represented by "$x^R + jx^I$" and that the complex gain tap coefficient is represented by "$C^R + jC^I$", $$(x^R + jx^I)(C^R + jC^I) = x^R C^R - x^I C^I + j(x^R C^I + x^I C^R) \tag{1}$$

Accordingly, it is required to perform actually four multiplication operations and two addition/subtraction operations in each of the complex multipliers 768. The error detector 77 comprises a data discriminator 772 and subtracter 771. The gain tap coefficient adjusting unit 78 comprises three conjugate complex data output function generators 781, a complex multiplier 782, three complex multipliers 783 and three adders 784.

The complex gain tap coefficients for the baseband equalizer filter 76 are adjusted in the gain tap coefficient adjusting unit 78 utilizing a maximum descent repetition method as follows:

$$C_{m,n} = C_{m,n-1} - K \cdot \Delta E \qquad (2)$$

wherein $\Delta E$ represents a quantity to be adjusted in the order of the n-th time, and $C_{m,n}$ represents the complex gain tap coefficient in the m-th order for the baseband equalizer filter 76 being subjected to the n-th time adjustment. K represents an appropriate factor (real number) for ensuring the focusing of the expression (2), which is entered in the complex multiplier 782. In the case of the QAM demodulator shown in FIG. 1, $\Delta E$ is represented by an equation (3) as follows:

$$\Delta E = E_k \cdot \text{conj}(X_{k-p}) \qquad (3)$$

wherein $E_k$ represents an error data outputted from the error detector 77 at the time of k, and $X_{k-p}$ represents the complex input data applied to the baseband equalizer filter 76 at the time k-p. conj( ) represents a function varying with conjugate complex numbers, the operation of which is performed in the conjugate complex data output function generators 781.

As shown in FIG. 2, in the conventional QAM demodulator, it is required to provide six filter operating units 753, 754, and 761 to 764. The filtering operations performed in the filter operating units includes a number of operations for multiplication and addition. In recent years, such a QAM demodulator is generally realized using DSP chip with application of digital signal processing techniques. However, this large number of multiplication and addition operations results in a great load on the DSP, and therefore, it is required to provide a high speed DSP chip with large capacity. Such a DSP chip is usually expensive and the spaces for semiconductor chips provided therein become large.

SUMMARY OF THE INVENTION

Therefore, an essential object of the present invention is to provide a QAM demodulator using an automatic equalizer, reducing a load of a hardware such as DSP and lowering the production cost thereof.

In order to attain the object mentioned above, the automatic equalizer according to the present invention includes:
- a transversal filter of a band-pass filter type with its complex gain tap coefficients being adjustable, in which data to be demodulated are applied;
- a reference carrier generator for generating a complex reference carrier consisting of a pair of real and imaginary parts, both real and imaginary parts being in quadrature to each other; and
- a gain tap coefficient adjusting unit for adjusting the complex gain tap coefficients for the transversal filter using the complex error data transmitted from the error detector and complex reference carrier data transmitted from the reference carrier generator.

Another feature of the invention, the QAM demodulator includes:
- a transversal filter of a band-pass filter type with its complex gain tap coefficients being adjustable, in which QAM data is entered;
- a reference carrier generator for generating a complex reference carrier consisting of a pair of real and imaginary parts, both real and imaginary parts being in quadrature to each other;
- a complex multiplier for multiplying complex data outputted from the transversal filter by the value of the complex reference carrier;
- an error detector for obtaining complex error data based on the output data of the complex multiplier; and
- a gain tap coefficient adjusting unit for adjusting the complex gain tap coefficients using the complex error data transmitted from the error detector and complex reference carrier data transmitted from the reference carrier generator.

According to a feature of the present invention, it is possible to provide an automatic equalizer for constituting a QAM demodulator in which filtering units necessary for filtering operations can be substantially decreased compared to those in a conventional device. With a QAM demodulator of the present invention, it is not necessary to provide hardware such as a conventional high speed processing DSP chip with large capacity, thereby substantially reducing the production cost thereof.

Other advantages and features of the present invention will be apparent from the description and drawings herein of a preferred embodiment.

DESCRIPTION OF THE PREFERRED EMBODIMENT

A preferred embodiment of the present invention is explained hereinafter with reference to the accompanying drawings.

Figure 4:
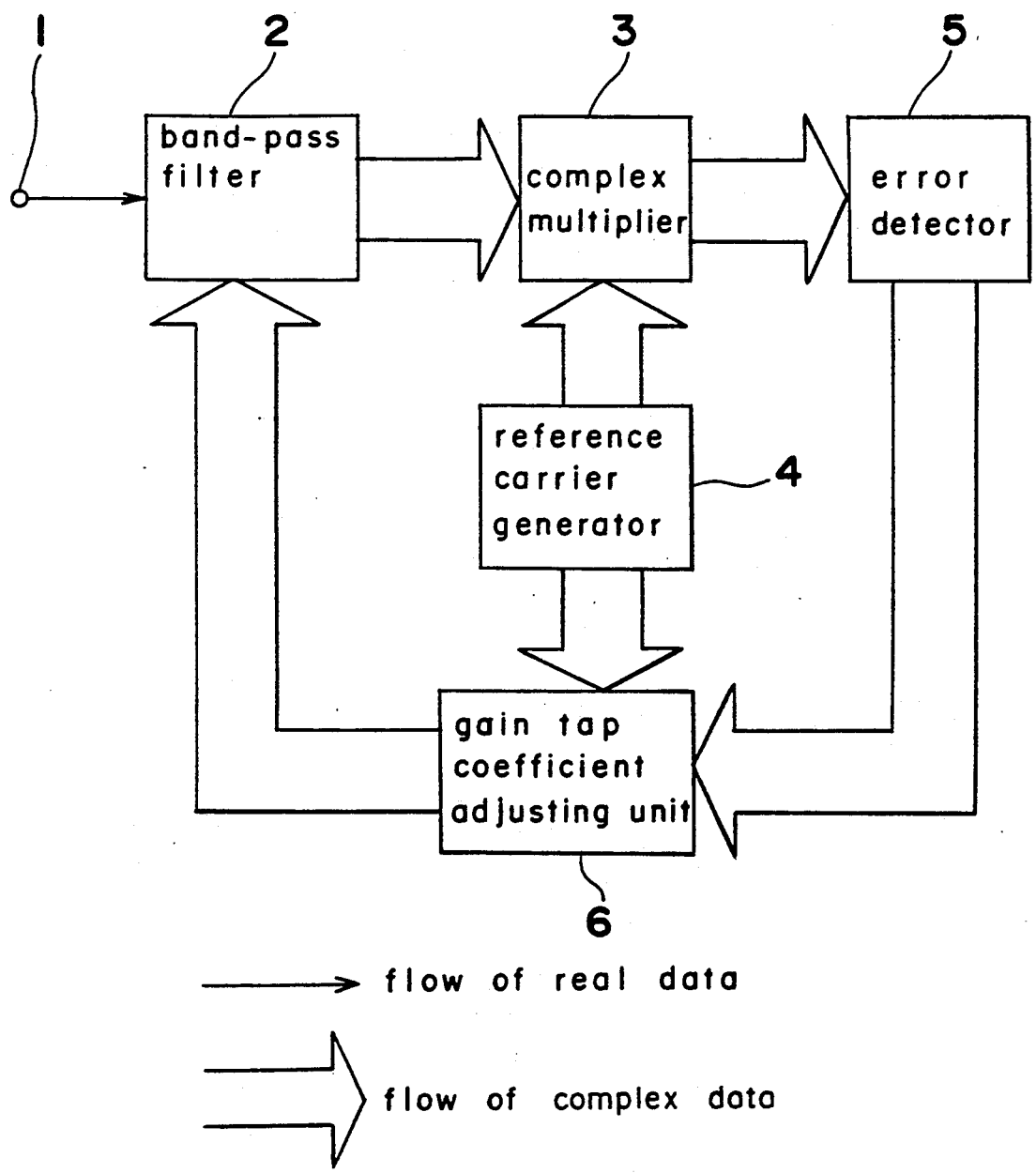
FIG. 4 is a schematic block diagram showing an embodiment of a QAM demodulator according to the present invention.

FIG. 4 shows a preferred embodiment of a QAM demodulator utilizing digital signal processing techniques such as DSP. In FIG. 4, the QAM demodulator comprises an automatic equalizer which is composed of a band-pass filter 2, reference carrier generator 4 and gain tap coefficient adjusting unit 6, and further comprises a complex multiplier 3 and error detector 5 .

An A/D (analogue-to-digital) converted signal received by an input terminal 1 of the QAM demodulator is applied to the band-pass filter 2 composed of a transversal filter which is provided in the automatic equalizer. The reference carrier generator 4 generates a complex reference carrier in a manner similar to the reference carrier generator 74 used in the conventional receiver (see FIG. 1). That is, the complex reference carrier generated by the reference carrier generator 4 consists of real and imaginary parts, both parts being in quadrature to each other. In the complex multiplier 3, the complex data transmitted from the band-pass filter 2 is multiplied by the value of the complex reference carrier transmitted from the reference carrier generator 4. The error detector 5 detects the error of the distortion inherent to the communication line on the basis of the output data of the complex multiplier 3 so as to output the complex error data. The gain tap coefficient adjusting unit 6 adjusts the complex gain tap coefficients for the band-pass filter 2 on the basis of the complex error data transmitted from the error detector 5 and the complex reference carrier data transmitted from the reference carrier generator 4.

Figure 5:
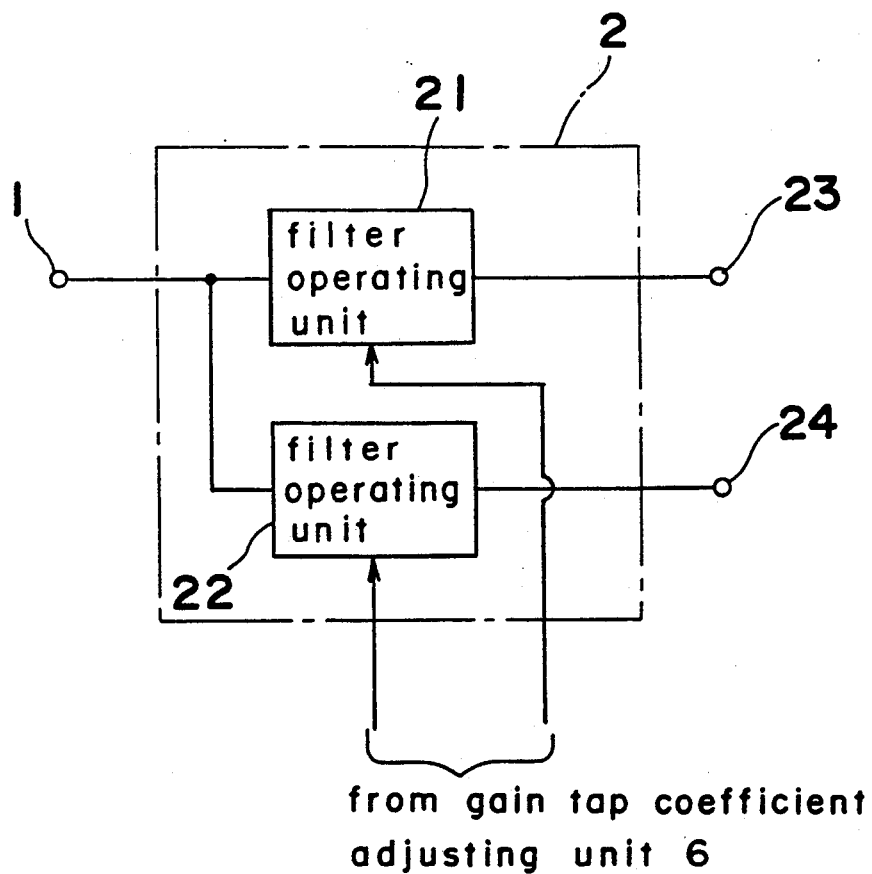
FIG. 5 is a block diagram showing a schematic construction of a band-pass filter in the embodiment.

FIG. 5 shows a schematic construction of the band-pass filter 2 provided in the automatic equalizer, which comprises two filter operating units 21 and 22. The real and imaginary parts of the complex output data of the band-pass filter 2 are outputted to the terminals 23 and 24 through the filter operating units 21 and 22 respectively. In this embodiment, the filtering operation is not performed except in the band-pass filter 2. In other words, in this embodiment of the QAM demodulator using the band-pass filter typed automatic equalizer compared to the conventional QAM demodulator using the baseband type automatic equalizer (see FIG. 1), the number of the filter operating units is decreased from 6 to 2 (i.e., one-third). Accordingly, the load of the filtering operations applied to DSP can be substantially reduced.

Figure 1:
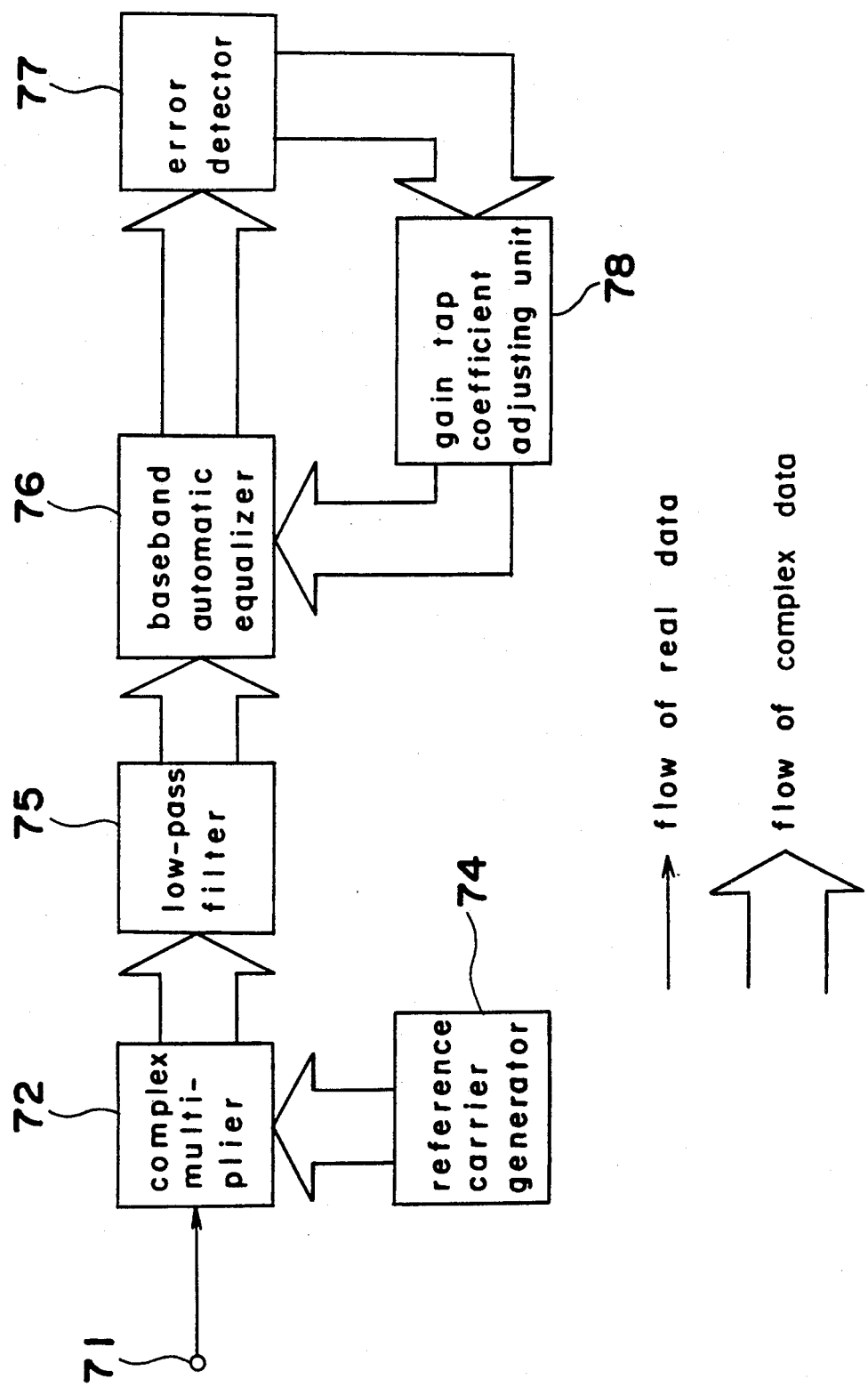
FIG. 1 is a block diagram showing an example of a conventional QAM demodulator.
Figure 2:
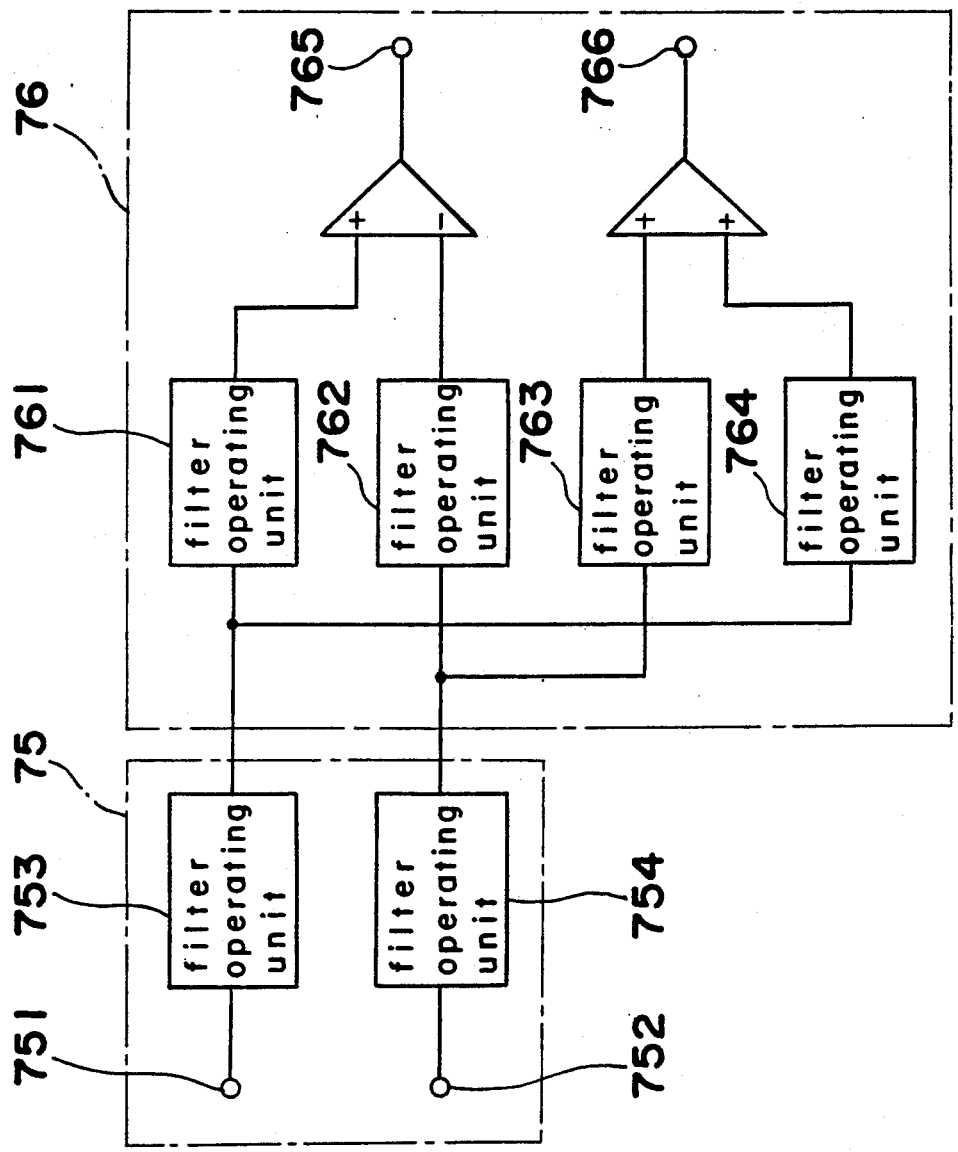
FIG. 2 is a block diagram showing a schematic diagram of a low-pass filter and automatic baseband equalizer filter employed in the QAM demodulator of FIG. 1.
Figure 3:
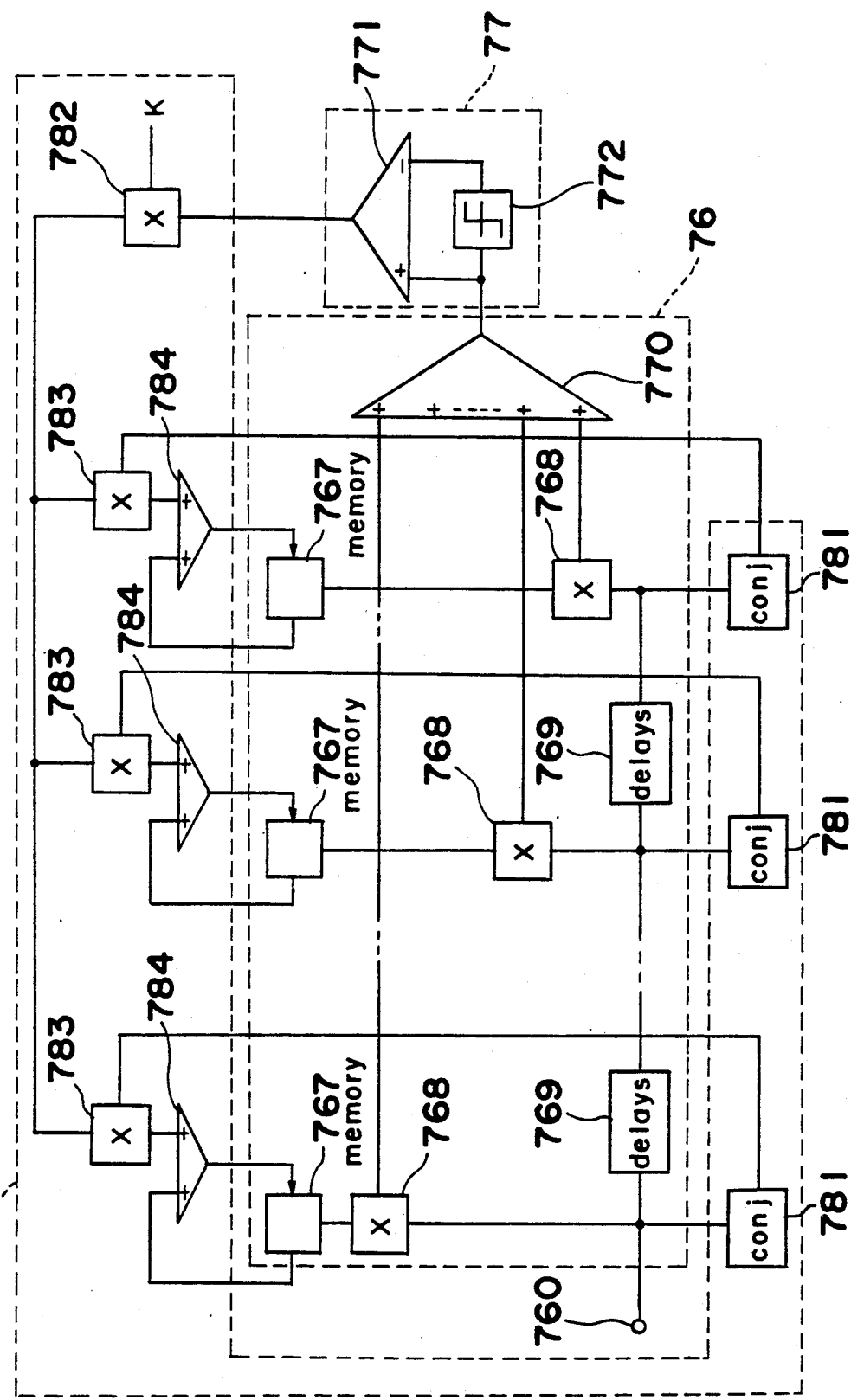
FIG. 3 is a block diagram showing a schematic diagram including an automatic baseband equalizer filter, error detector and gain tap coefficient adjusting unit in the QAM demodulator in FIG. 1.

In order to show it is possible to demodulate a QAM signal through the preferred embodiment of the QAM demodulator of the present invention, the operation of the conventional example shown in FIG. 1 is first explained using algebraic expressions.

In the conventional QAM demodulator shown in FIG. 1, the value of the signal applied to the input terminal 71 at the time k is $S_k$, the complex data outputted from the baseband equalizer filter 76 is $Y_k$, the n-th impulse response (complex number) of the low-pass filter 75 is $H_n$, the m-th impulse response (complex number) of the baseband equalizer filter 76 is $C_m$, and the impulse response obtained by convolution of the impulse response of the low-pass filter 75 with the impulse response of the baseband equalizer filter 76 is $U_n$, and the complex value of the reference carrier to be demodulated outputted from the reference carrier generator 74 is $\exp(-j\omega_c k)$, the convolution impulse response $U_n$ is represented as follows:

$$U_n = \sum_m C_m \cdot H_{n-m} \qquad (4)$$

By using the expression (4), the output complex data $Y_k$ is represented as follows:

$$Y_k = \sum_n U_n \cdot S_{k-n} \cdot \exp\{-j\omega_c(k-n)\} \qquad (5)$$

By modifying the expression (5), $$Y_k = \left( \sum_n U_n \cdot \exp(j\omega_c n) \cdot S_{k-n} \right) \times \exp(-j\omega_c k) \qquad (6)$$

The expression (6) indicates that the demodulated output value $Y_k$ is obtained by multiplying the output data of the band-pass filter 2 by the complex value $\exp(-j\omega_c k)$ of the reference carrier when the input signal is $S_k$ and the n-th impulse response is $U_n \cdot \exp(j\omega_c n)$.

In addition, since the impulse response $U_n$ is obtained by convolution of both the impulse responses of the low-pass filter 75 and the baseband equalizer filter 76, the convolution impulse response $U_n$ represents the frequency characteristics of a low-pass filter type. On the other hand, by multiplying $U_n$ by $\exp(j\omega_c n)$, the demodulated output $Y_k$ of the band-pass filter 2 has the frequency characteristic of a band-pass filter type.

Figure 6:
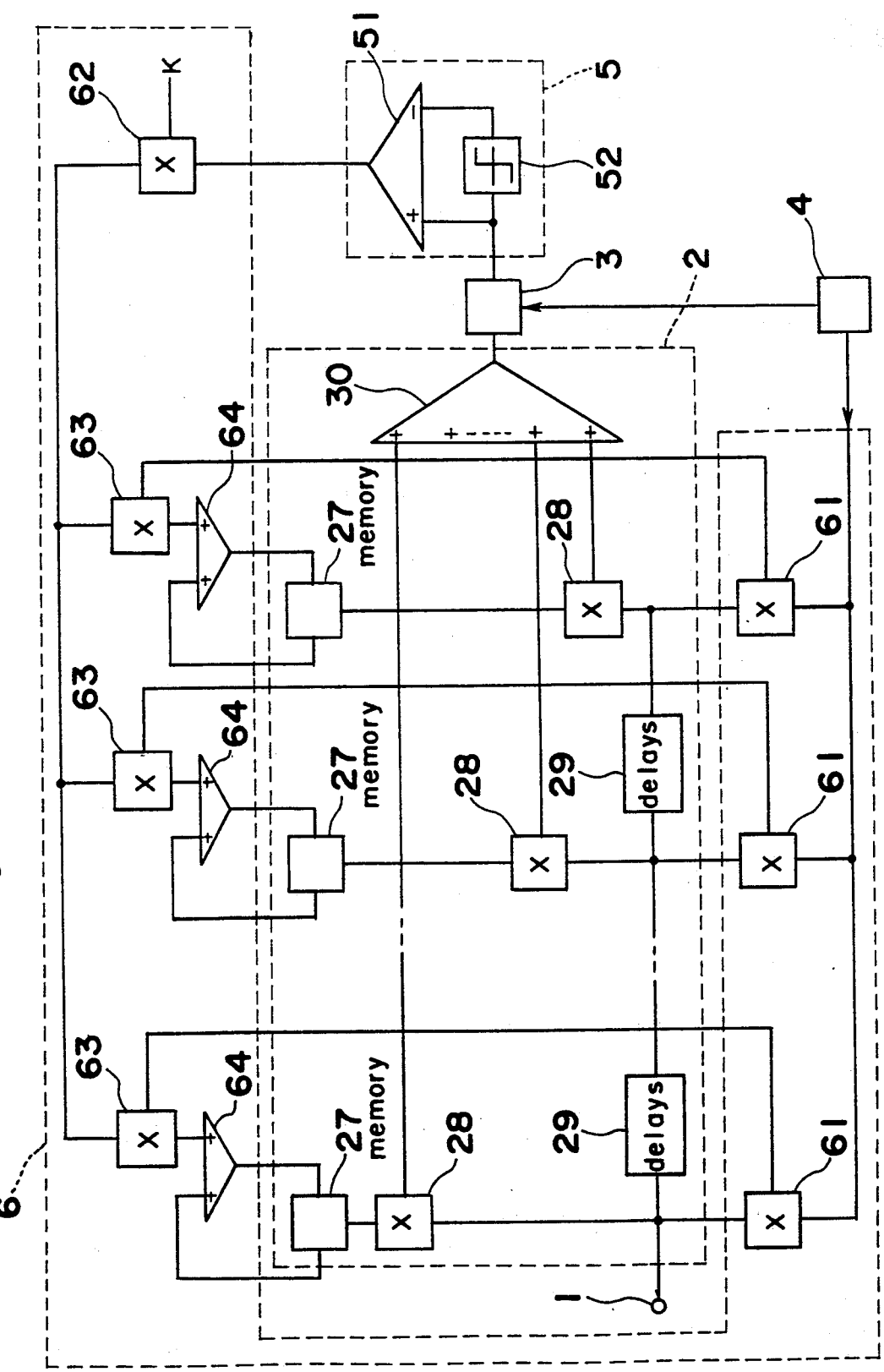
FIG. 6 is a block diagram showing a detail construction of the embodiment.

In FIG. 6, it is noted that the received data signal applied to the input terminal 1 and the delayed data of the received signal delayed by delay units 29 are data of real numbers and that the other data are all complex data. The band-pass filter 2 has a construction of a transversal filter, which includes three memory units 27 for storing the complex gain tap coefficients, three complex multipliers 28, two real data delay registers 29 for delaying the input data of real numbers, and an adder 30. In the complex multipliers 28, providing that the input data applied to the input terminal 1 is x and the complex gain tap coefficient is $C^R + jC^I$, the complex multiplication represented by the following expression (7) is performed:

$$x \cdot (C^R + jC^I) = xC^R + jxC^I \qquad (7)$$

Accordingly, in the complex multipliers 28, the multiplying operations are actually performed two times. The error detector 5 includes a data discriminator 52 and a subtracter 51. The gain tap coefficient adjusting unit 6 includes three complex multipliers 61 connected to the reference carrier generator 4 in parallel, a complex multiplier 62 connected to the subtracter 51, three complex multipliers 63 connected to the multiplier 62 in parallel, and three addition/subtraction units 64.

The complex gain tap coefficients for use in the band-pass filter 2 are adjusted by using the maximum descent repetition the above-mentioned method utilizing the above-mentioned equation (2) similarly in the conventional method except that the quantity $\Delta E$ to be adjusted in the n-th order is represented as follows:

$$\Delta E = E_k \cdot \exp(-j\omega_c k) \cdot S_{k-p} \qquad (8)$$

wherein $E_k$ is a complex error data outputted from the error detector 5 at the time k, and $S_{k-p}$ is an input data applied to the band-pass filter 2 at the time k-p.

In the gain tap coefficient adjusting unit 6, the coefficient K is multiplied by the complex error data $E_k$ in the complex multiplier 62. In the complex multipliers 61, the complex data of the reference carrier outputted from the reference carrier generator 4 are multiplied by the input data x (or delayed input data), so that the output data of the complex multipliers 61 are respectively multiplied by the output data of the complex multiplier 62 in the complex multipliers 63, thereby obtaining the complex quantity $K \cdot \Delta E$ for adjusting the complex gain tap coefficients for the band-pass filter 2.

Figure 7:
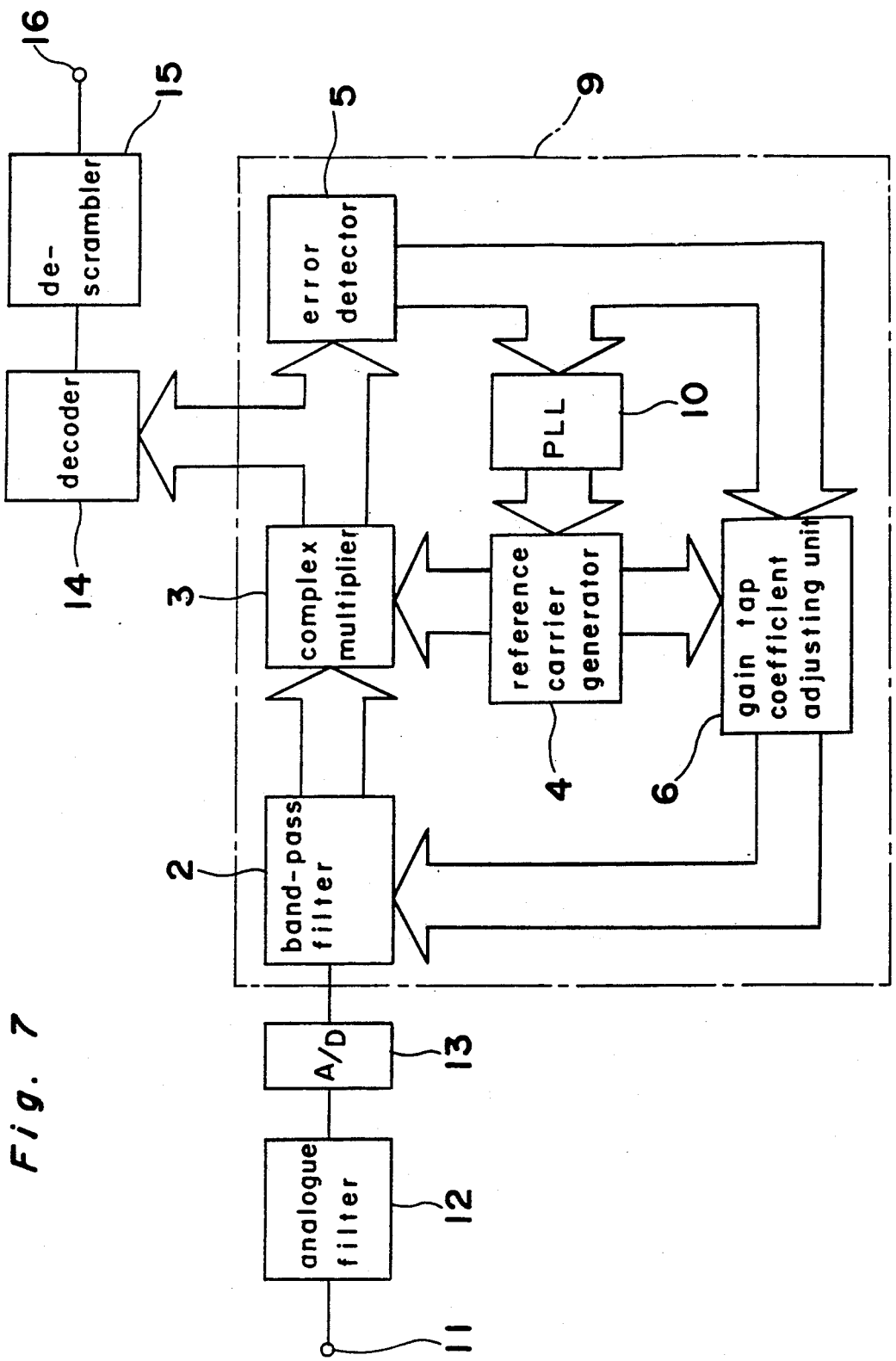
FIG. 7 is a block diagram showing an example of Comité Consultantif International Télégraphigue at Téléphonique CCITT ADVICE V. 29 MODEM utilizing the QAM demodulator in FIG. 4.

FIG. 7 shows an embodiment of the QAM demodulator of the present invention applied to a CCITT ADVICE V.29 modem. As shown in FIG. 7, the QAM demodulator 9 surrounded by a broken line has a construction similar to that of the demodulator shown in FIG. 4 except that there is provided a PLL unit 10 for phase-locking of the reference carrier generator 4 based on the output error data of the error detector 5. A received analogue signal applied to the input terminal 11 is filtered through an analogue filter 12 and is analogue-to-digital (A/D) converted through an analogue-to-digital (A/D) converter 13, thereafter the output digital signal of the A/D converter 13 is input to the band-pass filter 2 provided in the demodulator 9. The demodulated signal outputted from the complex multiplier 3 is transmitted to the output terminal 16 through a decoder 14 and through a de-scrambler 15, thereby obtaining the output data of the modem.

According to the present invention, it becomes possible to provide an automatic equalizer for constituting a QAM demodulator in which filtering units required to be provided for filtering operations can be substantially decreased compared to those in the conventional device. With a QAM demodulator of the present invention, it is not necessary to provide a conventional high speed processing DSP with large capacity, thereby substantially reducing the production cost thereof.

What is claimed is:

1. An automatic equalizer comprising:
   transversal filter means of a band-pass filter type including adjustable complex gain tap coefficients, and input means for receiving input data to be demodulated to produce a filtered signal;
   reference carrier generating means for generating a complex reference carrier including a pair of real and imaginary parts, both said real and imaginary parts being in quadrature to each other; and
   gain tap coefficient adjusting means for adjusting the complex gain tap coefficients using the complex reference carrier data transmitted from the reference carrier generating means and the input data applied to said transversal filter means.

2. The automatic equalizer as defined in claim 1, wherein said band-pass filter means comprises two filter operating units.

3. The automatic equalizer of claim 2, wherein a real and imaginary part of the filtered complex data of said band-pass filter means are outputted to a plurality of output terminals through a plurality of filter operating units and filtering is performed only by said band-pass filter means.

4. The automatic equalizer as defined in claim 1, wherein said band-pass filter means includes memory means for storing the complex gain tap coefficients, real data delay means for delaying the input data, and complex multiplying means for multiplying the delayed input data by the complex gain tap coefficients.

5. A QAM demodulator comprising:
   band-pass filter means including,
      adjustable complex gain tap coefficients,
      input means for receiving QAM data, and
      means for outputting filtered complex data;
   reference carrier generating means for generating a complex reference carrier including a pair of real and imaginary parts, both said real and imaginary parts being in quadrature to each other;
   complex multiplying means for multiplying the filtered complex data outputted from said band-pass filter means by the complex reference carrier generated by said reference carrier generating means to produce complex multiplied data;
   error detecting means for detecting and outputting complex error data based on the complex multiplied data of said complex multiplying means; and
   gain tap coefficient adjusting means for adjusting the complex gain tap coefficients using the complex error data outputted from said error detecting means and a complex product of the complex reference carrier generated by said reference carrier generating means and the QAM data input to said band-pass filter means.

6. The QAM demodulator as defined in claim 5, wherein said complex multiplying means performs a complex multiplication represented by $x \cdot (C^R + jC^I) = xC^R + jxC^I$ where x is the input data received by said band-pass filter means and $C^R + jC^I$ is the complex gain tap coefficient.

7. The QAM demodulator as defined in claim 5, wherein said error detecting means includes a data discriminator and a subtractor.

8. The QAM demodulator as defined in claim 6, wherein said gain tap coefficient adjusting means includes first complex multiplying means for multiplying the complex reference carrier generated by said reference carrier generating means by the input data or a delayed input data to produce a first complex output, second complex multiplying means for multiplying a predetermined coefficient by the complex error data outputted from said error detecting means to produce a second complex output, third complex multiplying means for multiplying the first complex output from said first complex multiplying means by the second complex output from said second complex multiplying means, to produce a complex quantity for adjusting the complex gain tap coefficients for said band-pass filter means.

9. A modem comprising:
   analog filter means for filtering a received analog signal;
   A/D converting means for A/D converting the filtered analog signal;
   QAM demodulating means including,
      band-pass filter means with adjustable complex gain tap coefficients, into which QAM data is entered to output complex data,
      reference carrier generating means for generating a complex reference carrier including a pair of real and imaginary parts, both said real and imaginary parts being in quadrature to each other;
      complex multiplying means for multiplying the output complex data output by said band-pass filter means by the complex reference carrier generated by said reference carrier generating means to produce a complex multiplier output,
      error detecting means for outputting complex error data based on the complex multiplier output of said complex multiplying means and
      gain tap coefficient adjusting means for adjusting the complex gain tap coefficients using the complex error data output by said error detecting means and complex products obtained by multiplying the complex reference carrier generated by said reference carrier generating means by the OAM data input to said band-pass filter means; and
   phase locked looping means for locking a phase of the complex reference carrier generated by said reference carrier generating means based on the complex error data output by said error detecting means; said complex multiplier output produced by said complex multiplying means being transmitted as an output of said modem.

* * * * *